US008111562B2

United States Patent
Yamamura et al.

(10) Patent No.: US 8,111,562 B2
(45) Date of Patent: Feb. 7, 2012

(54) SEMICONDUCTOR STORAGE DEVICE AND METHOD OF READING DATA THEREFROM

(75) Inventors: Toshio Yamamura, Yokohama (JP); Masanobu Shirakawa, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 597 days.

(21) Appl. No.: 12/342,921

(22) Filed: Dec. 23, 2008

(65) Prior Publication Data

US 2009/0168530 A1 Jul. 2, 2009

(30) Foreign Application Priority Data

Dec. 26, 2007 (JP) ................................. 2007-335280

(51) Int. Cl.
*G11C 7/00* (2006.01)
(52) U.S. Cl. .............................. 365/189.15; 365/189.17
(58) Field of Classification Search ............. 365/189.15, 365/189.17, 189.05, 230.08
See application file for complete search history.

(56) References Cited

U.S. PATENT DOCUMENTS

| | | | |
|---|---|---|---|
| 2001/0037428 A1* | 11/2001 | Hsu et al. ...................... | 711/105 |
| 2003/0214853 A1 | 11/2003 | Hosono et al. | |
| 2005/0027929 A1* | 2/2005 | Hsu et al. ...................... | 711/105 |
| 2005/0157564 A1 | 7/2005 | Hosono et al. | |
| 2005/0174862 A1 | 8/2005 | Watanabe et al. | |
| 2006/0224820 A1 | 10/2006 | Cho et al. | |
| 2006/0245270 A1 | 11/2006 | Louie et al. | |

FOREIGN PATENT DOCUMENTS

JP 2007-213806 8/2007

* cited by examiner

*Primary Examiner* — Vu Le
(74) *Attorney, Agent, or Firm* — Oblon, Spivak, McClelland, Maier & Neustadt, L.L.P.

(57) ABSTRACT

A semiconductor memory device comprises a first memory cell array having a first plane which is composed of a plurality of blocks each having a plurality of memory cells, a sense circuit which reads data the memory cells, a sequencer which receives control signals from outside, a first address register, and a second address register which receives an output address from the first address register and outputs an address signal in response to an address control signal from the sequencer. In reading from the memory cells, the sequencer reads a page n in accordance with the address stored in the second address register, then transfers an address stored in the first address register to the second address register concurrently with outputting data read from the page n to outside and reads data from an arbitrary page m in accordance with the address transferred to the second address register.

20 Claims, 11 Drawing Sheets

Cache read operation(first embodiment)

Cache read operation(comparative example)

FIG. 12

Cache read operation(comparative example)

SEMICONDUCTOR STORAGE DEVICE AND METHOD OF READING DATA THEREFROM

CROSS-REFERENCE TO RELATED APPLICATIONS

This application is based upon and claims the benefit of priority from prior Japanese Patent Application No. 2007-335280, filed Dec. 26, 2007, the entire contents of which are incorporated herein by reference.

BACKGROUND OF THE INVENTION

1. Field of the Invention

The present invention relates to a semiconductor storage device and a method of reading data from the storage device.

2. Description of the Related Art

An example of a cache read operation of a NAND flash memory involves designating the address of a leading page to read it and then reading consecutive pages in a designated block by incrementing the page address each time a page is read (see, for example, Jpn. Pat. Appln. KOKAI Publication No. 2007-213806).

However, this conventional system can only read two or more pages contained in a single block consecutively. Thus, it is impossible to make random access to page data. For example, the cache read operation cannot be used in reading information stored in specific pages of each block so as to span two or more blocks. The usual read operation has to be performed on specific pages in each block by which, for each page, data are transferred from memory cells to the data register and data in the data register are output to the outside. This is disadvantageous to speeding up of the data read operation.

In applications using a NAND flash memory, user data and their associated management data are stored. The user data are usually stored across two or more blocks. The associated management data are stored in certain units of user data. In this case, the management data reside scattered on the memory space. In other words, the management data reside in random blocks and pages. Depending on circumstances, user data do not necessarily reside in consecutive pages and may reside scattered across two or more blocks.

Thus, it is also required to quickly read data which reside in random locations in the address space. The conventional cache read system cannot be used in reading data which reside scattered in two or more blocks, which is disadvantageous to speeding up the read operation. In addition, the data transfer rate in the entire memory system decreases.

BRIEF SUMMARY OF THE INVENTION

According to an aspect of the invention, there is provided a semiconductor memory device comprising: a first memory cell array having a first plane which is composed of a plurality of blocks each having a plurality of memory cells arranged in a matrix form at intersections of bit lines and word lines; a sense circuit which reads data the memory cells; a sequencer which receives control signals from outside; a first address register which receives an address from outside; and a second address register which receives an output address from the first address register and outputs an address signal in response to an address control signal from the sequencer, the sequencer, in reading from the memory cells, reading a page n in accordance with the address stored in the second address register, then transferring an address stored in the first address register to the second address register concurrently with outputting data read from the page n to outside and reading data from an arbitrary page m in accordance with the address transferred to the second address register.

According to another aspect of the invention, there is provided a method of reading data from a semiconductor memory device comprising: reading a page n in accordance with an address stored in a second address register; transferring an address stored in a first address register to the second address register concurrently with outputting of data read from the page n to outside; and reading an arbitrary page m in accordance with the transferred address.

DETAILED DESCRIPTION OF THE INVENTION

An embodiment of the present invention will be described hereinafter with reference to the accompanying drawings. The embodiment will be described by way of an example of using a NAND flash memory which is a nonvolatile semiconductor storage device as a semiconductor storage device. In the description which follows, like reference characters designate like or corresponding parts throughout the drawings.

First Embodiment

1. Configuration 1-1. Overall Configuration

Figure 1:
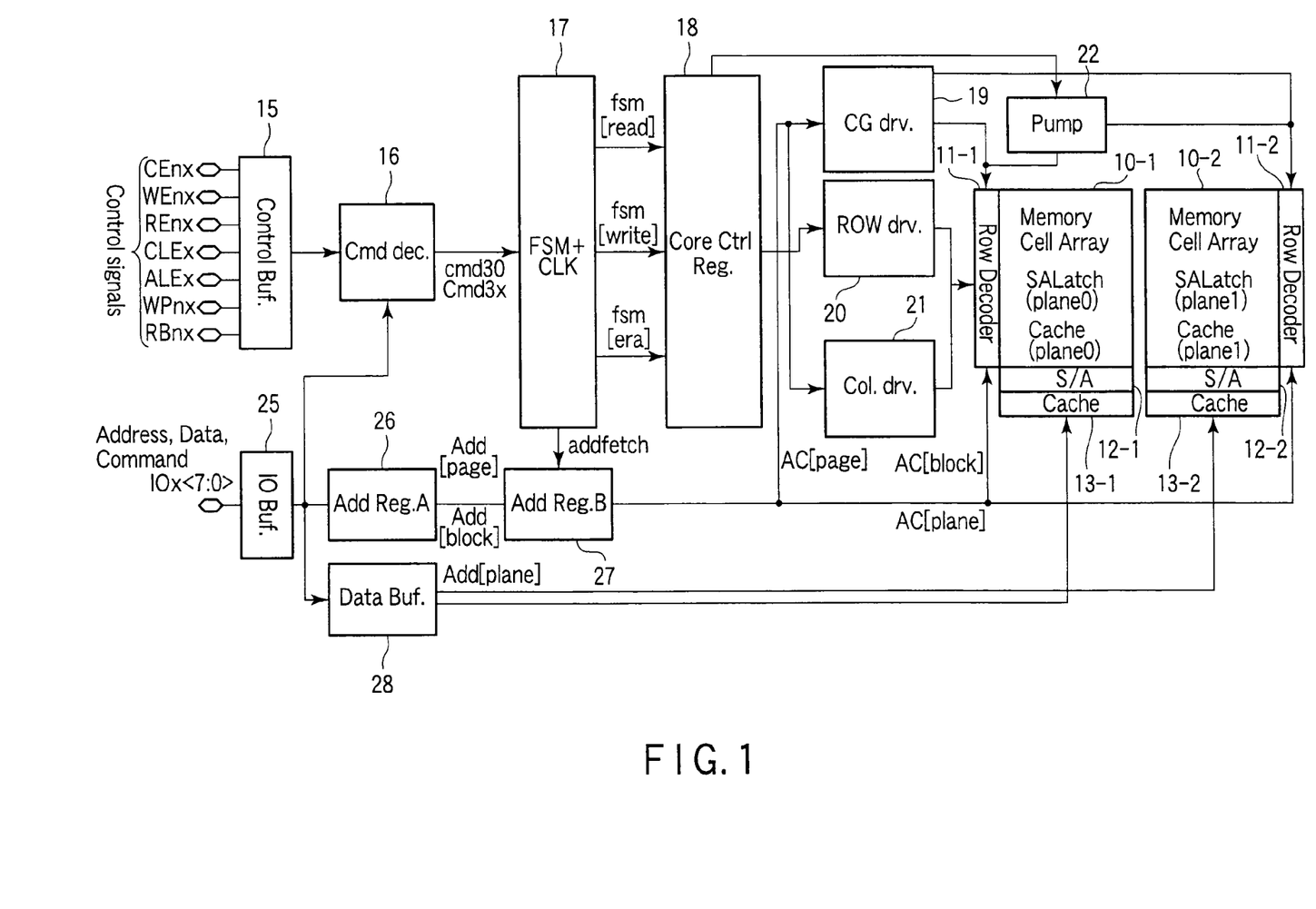
FIG. 1 is a block diagram of a semiconductor storage device according to a first embodiment of the invention.

Reference is first made to FIG. 1 to describe the overall configuration of a semiconductor storage device according to a first embodiment of the present invention. In this embodiment, a description is given of a multi-plane memory having two planes (plane 0 and plane 1). FIG. 1 is a block diagram of a NAND flash memory of the first embodiment.

As shown, the NAND flash memory includes memory cell arrays 10-1 and 10-2, row decoders 11-1 and 11-2, sense amplifiers (sense circuits) 12-1 and 12-2, data caches 13-1 and 13-2, a control buffer 15, a command decoder 16, a sequencer 17, a core control register 18, a control gate driver 19, a row driver 20, a column driver 21, a pump circuit 22, an IO buffer 25, a first address register 26, a second address register 27, and a data buffer 28.

The memory cell arrays 10-1 and 10-2 are each comprised of a plane (plane 0, plane 1) as will be described later. Each plane is composed of a plurality of blocks (block A, . . . , block Z). Each block has a number of transistors arranged in a matrix form at intersections of word lines and bit lines.

The row decoders 11-1 and 11-2 are placed adjacent to the memory cell arrays 10-1 and 10-2, respectively, and, during data cache read by way of example, apply given voltages to the word and bit lines under the control of the control gate driver 19, the row driver 20, the column driver 21, etc.

The sense amplifiers (S/A) 12-1 and 12-2 amplify cell currents from bit lines to read memory cell data during data cache read.

The data caches 13-1 and 13-2 temporarily hold data read from or written into memory cells.

The control buffer 15, which is connected to a plurality of control pins (CEnx, WEnx, REnx, CLEx, ALEx, WPnx, PBnx), amplifies and holds control signals applied to these pins from outside.

<Control Signals>

Here, the control signals input to the control pins are as follows:

A chip enable (CEn) signal is input to the control pin (CEnx). The chip enable signal is a device select signal for this NAND flash memory. In the ready state, when the chip enable signal is set to the high (H) level, the memory goes into the low-power standby mode. In the busy state (RY/–BY="L") when the programming, erase or cache read operation is in execution, the chip enable signal is allowed to take either of high- and low-level states.

A write enable (WEn) signal is input to the control pin (WEnx). This signal is one to feed data from the IO pin (IOx<7:0>) into the device.

A read enable (REn) signal is input to the control pin (REnx). This signal is one to serially output data from the IO pin (IOx<7:0>).

A command latch enable (CLE) signal is input to the control pin (CLEx). This signal controls the feed of operation commands into the device. For example, by setting the command latch enable (WEn) signal high when the write enable signal rises or falls, data on the IO pin (IOx<7:0>) is fed into the device as a command.

An address latch enable (ALE) signal is applied to the control pin (ALEx). This signal controls the feed of address data into the first address register 26 inside the device. For example, by setting the address latch enable signal high when the write enable signal rises, data on the IO pin (IOx<7:0>) is fed into the first address register 26 as address data.

The control pin (WPnx) is supplied with a write protect (WPn) signal, which forcibly inhibits a write or erase operation. For this reason, when the write protect signal is low (Wpn=L), the operation of the internal high-voltage generating circuit is reset. The write protect signal is used at the high level. However, when the input signal is indefinite as when the power is turned on or off, the write protect signal is set low, protecting stored data from unexpected operations.

The control pin (RBnx) is supplied with a ready/busy (RY/–BY) signal. The ready/busy (RY/–BY: hereinafter abbreviated to R/B) is an output signal to present the internal operating state of the storage device 11 to the outside. The signal is set low (R/B=L) at the time of a programming, erase, or read operation. Upon completion of the operation, the signal is automatically set high (R/B=H).

The command decoder 16 decodes commands from the control buffer 15 and sends commands (Cmd30, Cmd3x, etc.) to the FSM signal generating circuit 17.

The FSM signal generating circuit 17, acting as a sequencer, receives a command (Cmd30, Cmd3x, or the like) from the command decoder 16 and sends to the control register 18 a control signal fsm[read], fsm[write] or fsm[era] to control a data read, write or erase operation. The sequencer 17 outputs an address control signal (addfetch) which is a clock (CLK) signal to the second address register 27, which outputs an address signal (AC[page], AC[block], or AC[plane]).

The core control register 18 temporarily holds the control signal and sends it to the control gate driver 19.

The control gate driver 19 receives the control signal from the core control register 18 and the address signal AC[page] from the second address register to apply a given readout voltage onto word lines (control gates) of the memory cell arrays 10-1 and 10-2.

The row driver 20 receives the control signal from the core control register 18 to apply a given voltage to memory cells in the row direction.

The column driver 21 receives the control signal from the core control register 18 to apply a given voltage onto bit lines, thereby carrying out read operations using the sense amplifiers S/A.

The pump circuit 22 is electrically connected to the row decoders 11-1 and 11-2 of the memory cell arrays 10-1 and 10-2 to apply a given voltage to the row decoders.

The IO buffer (IO Buf) 25 is connected to the IO pin (IOx<7:0>) to amplify and hold input data to be written into the memory or output data read from the memory.

The first address register (Add Reg. A) 26 temporarily holds an address input from the IO buffer 25.

The second address register (Add Reg. B) 27 outputs a page address signal (AC[page]) to the control gate driver 19 in accordance with an address control signal from the sequencer 17 and outputs block and plane address signals (AC[block], AC[plane]) to the row decoders 11-1 and 11-2. In this embodiment, the addresses held in the first and second address registers are arbitrary addresses, such as page addresses Add[page], block addresses Add[block], and plane addresses Add[plane].

The data buffer 28 is connected to the IO buffer to amplify and hold input data from the IO buffer 25 or output data read from the memory cell array 10-1 or 10-2.

As described above, the NAND flash memory of this embodiment is equipped with the first address register 26 and the second address register 27 which responds to an output address signal of the first address register and an address control signal output from the sequencer 17 to output an address signal.

For this reason, in reading memory cell data, the sequencer 17 is allowed to read page n in accordance with an address stored in the second address register, then transfer an address stored in the first address register to the second address register at the same time as when data from the page n is output to the outside and read an arbitrary page m in accordance with that address.

Thus, even with the configuration in which the control gate driver 19 is common to the memory cell arrays 10-1 and 10-2 as in this embodiment, it is possible to carry out a cache read operation in which a plurality of pages having arbitrary block addresses is addressed randomly for each plane. This is useful in increasing the reading speed. In this case, the page address is common to the two planes. With the configuration in which the control gate driver 19 is set up for each plane, it would become possible to perform a cache read operation in which page addresses are arbitrarily designated for each plane.

1-2. Configuration of Memory Cell Array

Figure 2:
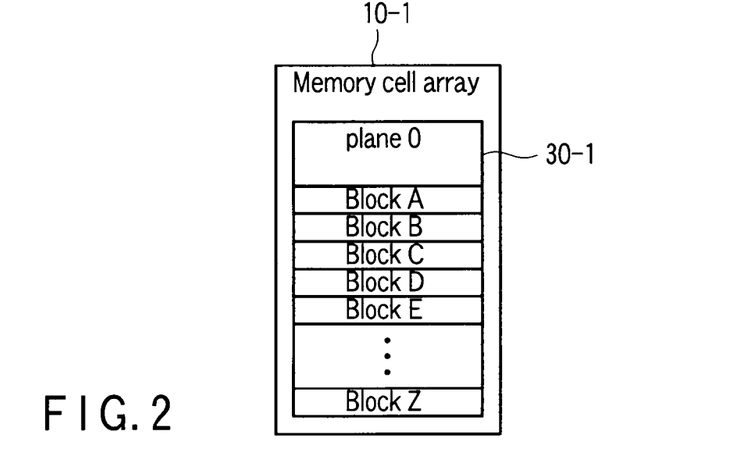
FIG. 2 shows the arrangement of a memory cell array in FIG. 1.

The configuration of the memory cell arrays 10-1 and 10-2 of the nonvolatile semiconductor storage device of the embodiment will be described next with reference to FIG. 2. Here, the memory cell array 10-1 in FIG. 1 will be described by way of example.

As shown, the memory cell array 10-1 has a plane (plane 0) 30-1. The plane 30-1 is composed of a plurality of blocks (block A, . . . , block Z). In the NAND flash memory of this embodiment, data erase is carried out on a block basis. Thus, the block is a unit of erasing.

1-3. Configuration of Memory Space of Plane

The memory space of the planes of the memory cell arrays 10-1 and 10-2 of the nonvolatile semiconductor storage device of the embodiment will be described next with reference to FIGS. 3 and 4. Here, the plane (plane 0) of the memory cell array 10-1 in FIG. 1 will be described by way of example.

As shown, each of the blocks (block A, . . . , block Z) in the plane (plane 0) is composed of a plurality of pages each of which corresponds to a respective one of the word lines. In the NAND flash memory of this embodiment, data are read or written on a page-by-page basis. Thus, the page is a unit of reading or writing.

Each of the pages is comprised of a data area 22-1 and a redundant area 22-2. The data area 22-1 is stored with general data, such as image data. The redundant area 22-2 is stored with, for example, an error correcting code (ECC).

In applications using the NAND flash memory, user data and its associated management data are stored. Usually, the user data is continuously stored across two or more blocks. The associated management data is stored every certain unit of user data. Here, the user data is general data, such as image data, to which the user can freely make access. The management data is information, such as security information, ID, etc., which is necessary for management of the memory.

Figure 3:
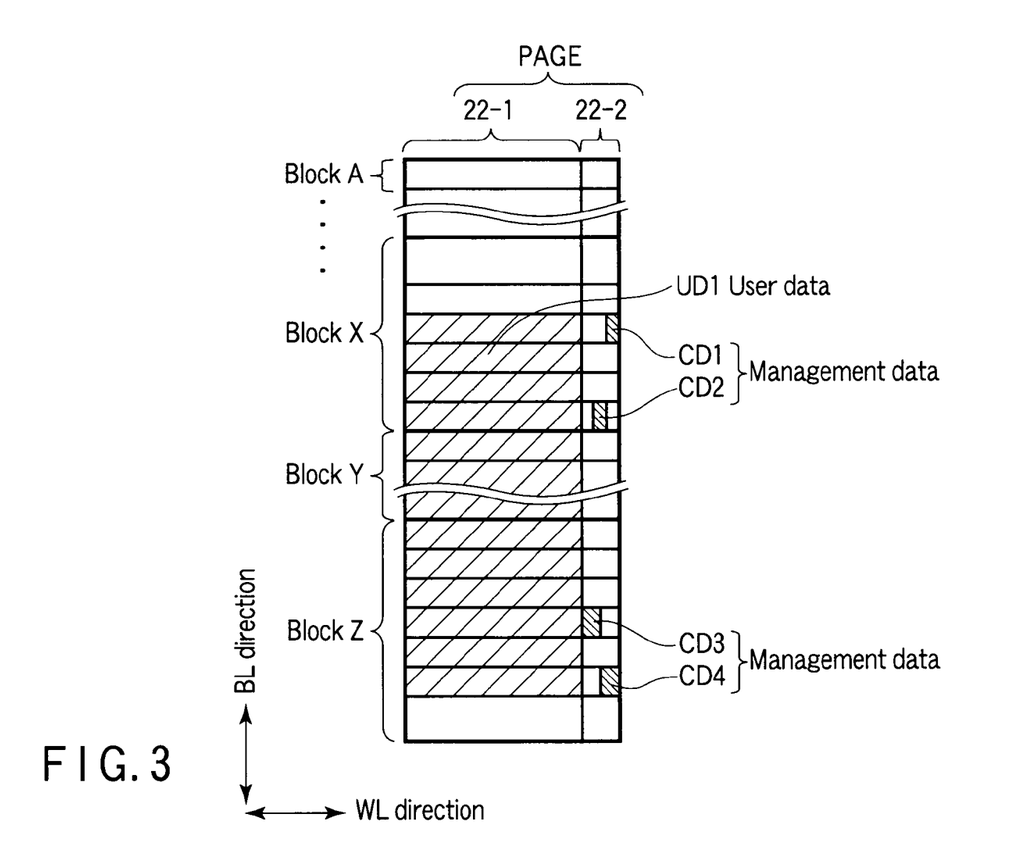
FIG. 3 shows an example of memory space in a plane in FIG. 1.

In the example of FIG. 3, user data UD1 is continuously stored in the data areas 22-1 so as to span three blocks (block X to block Z). The associated management data CD1 to CD4 are stored in the redundant areas 22-2 in certain units of the user data.

Thus, the management data CD1 to CD4 reside scattered on the memory space of the plane (plane 0). In other words, the management data reside in random blocks and pages.

Figure 4:
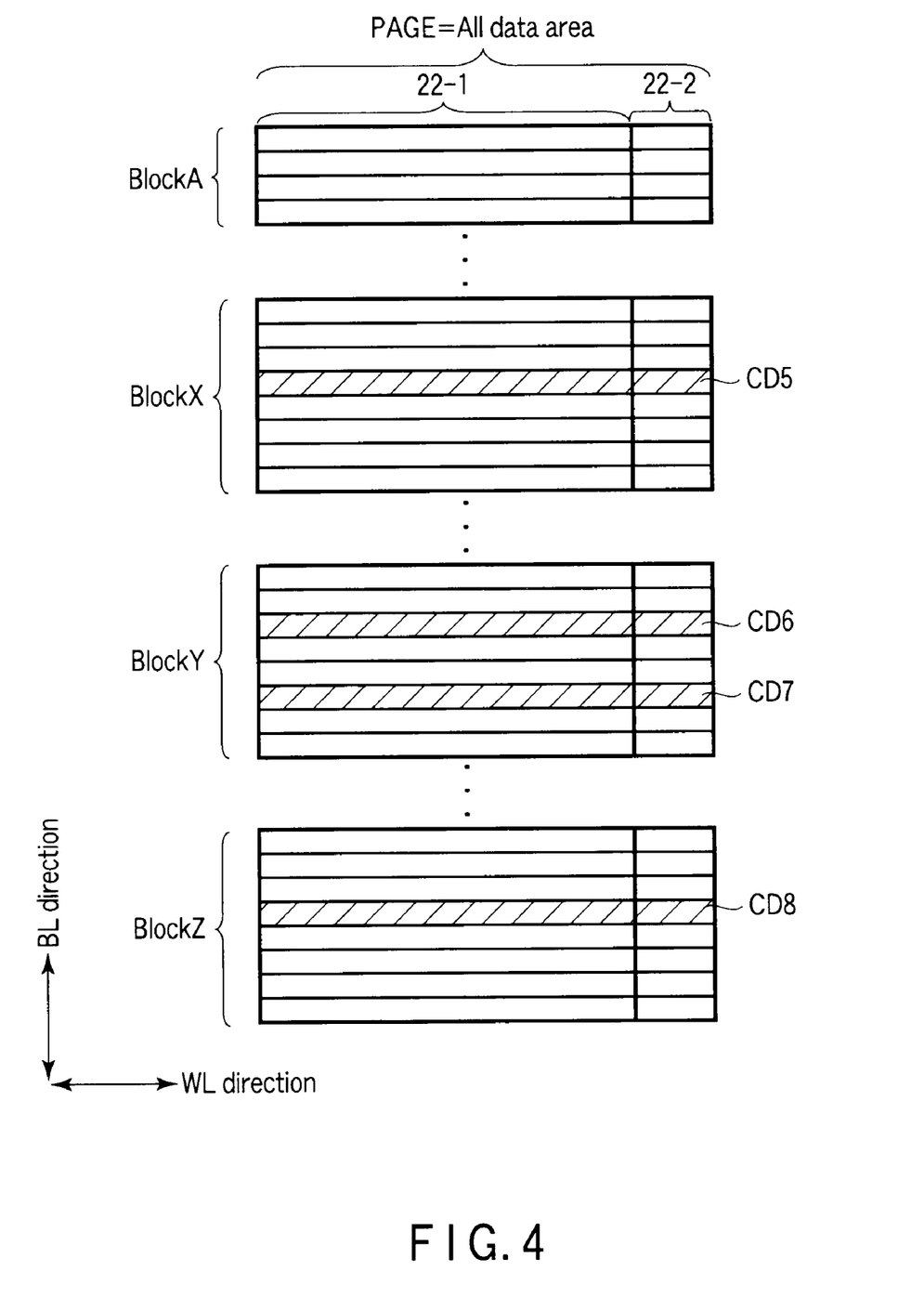
FIG. 4 shows an example of memory space in a plane in FIG. 1.

As shown in FIG. 4, depending on memory system applications, even management data CD5 to CD8 may reside in the data areas 22-1. In this case, the management data reside across several consecutive pages and two or more blocks. Besides user data, such management data CD5 to CD8 may need to be read continuously at a time from the entire chip or some areas within the chip.

Thus, since it is also required to read management data residing in random locations in the memory space, the conventional cache read system cannot be used in reading data scattered in two or more blocks. This is not useful in increasing the speed of data read operations in all the applications of the NAND flash memory. Also, the usability decreases.

As will be described later, the inventive configuration can perform cache read operations even where user data and management data reside scattered in the multi-plane memory space and hence has advantages that the data read operation can be speeded up and the data transfer rate in the entire memory system can be increased.

1-4. Configuration of Block

Figure 5:
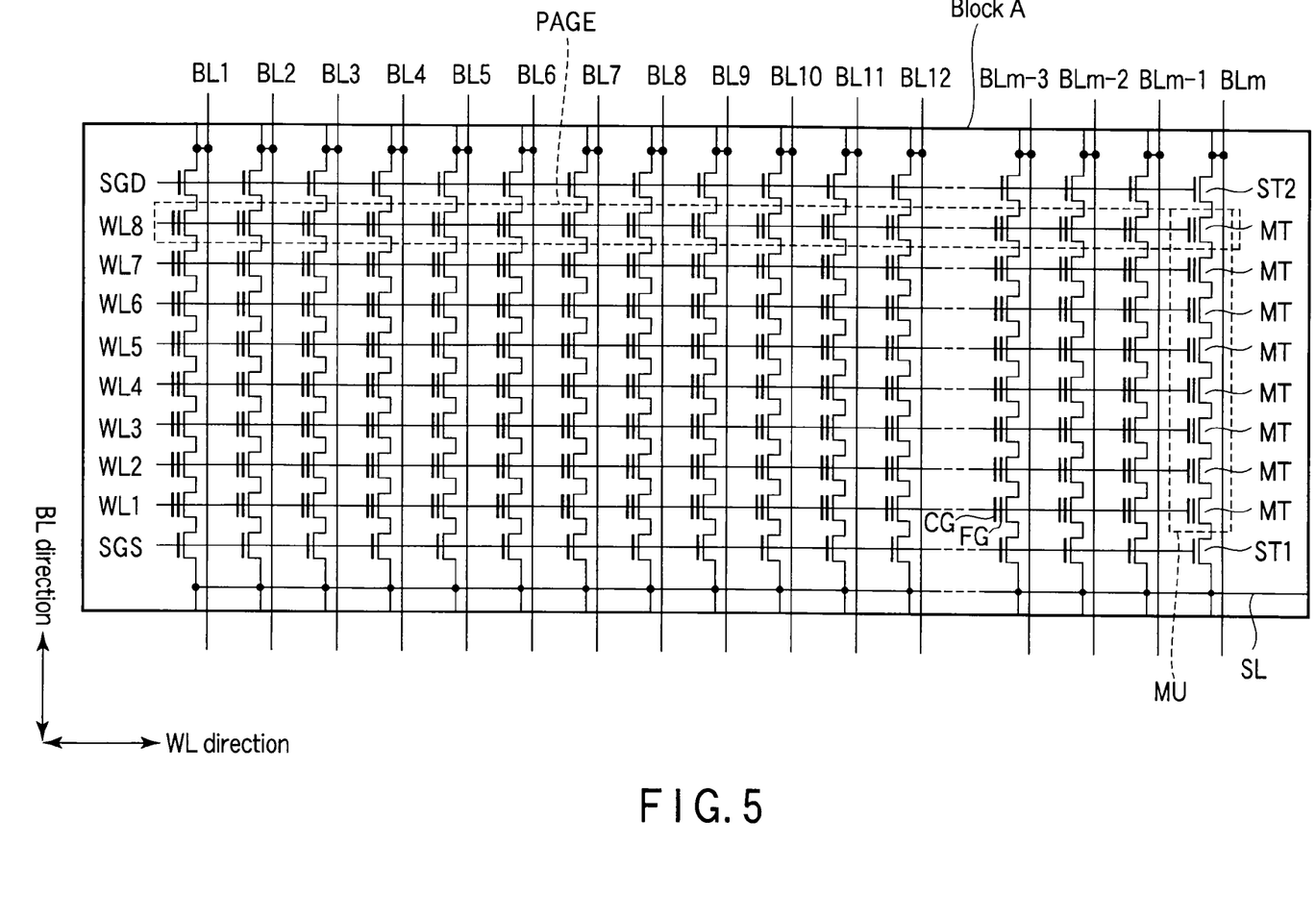
FIG. 5 is an equivalent circuit diagram of a block in the first embodiment.

Reference is next made to FIG. 5 to describe the configuration of the blocks (block A, . . . , block Z) of the nonvolatile semiconductor storage device of the embodiment. Here, a description is given of the block A in FIG. 2 by way of example.

As shown, the block A includes a plurality of memory cell units MU arranged in the WL direction and pairs of select transistors ST1 and ST2 each of which selects a corresponding one of the memory cell units.

Each of the memory cell units MU is composed of eight memory cell transistors MT having their current paths connected in series. The select transistor ST1 has its current path connected at one end to one end of the corresponding memory cell unit MU. The select transistor ST2 has its current path connected at one end to the other end of the corresponding memory cell unit MU. In this example, each memory cell unit is composed of eight memory cell transistors; however, this is not restrictive. It is only required that the memory cell unit be comprised of two or more memory cells.

The operation of reading from or writing into the NAND flash memory is carried out on a page-by-page basis. For this reason, the page is treated as a unit of reading or writing.

The other end of the current path of the select transistor ST1 is connected to a source line SL. The other end of the current path of the select transistor ST2 is connected to a bit line BL.

Word lines WL extend in the WL direction and are each connected in common to the control gates of memory cell transistors MT arranged in the WL direction. A select gate line SGS extends in the WL direction and is connected in common to the gate electrodes of the select transistors ST1 arranged in the WL direction. A select gate line SGD extends in the WL direction and is connected in common to the gate electrodes of the select transistors ST2 arranged in the WL direction.

Each of the memory cell transistors MT is gate stacked structure in which a gate insulating film, a floating gate electrode FG as a charge storage layer, an intergate insulating film and a control gate electrode are formed in this order on a semiconductor substrate. The floating gate electrode FG is separated for each memory cell transistor MT. The control gate electrode CG is common to a set of cell transistors arranged in the WL direction and connected to a word line.

1-5. Configuration of First and Second Address Registers

Figure 6:
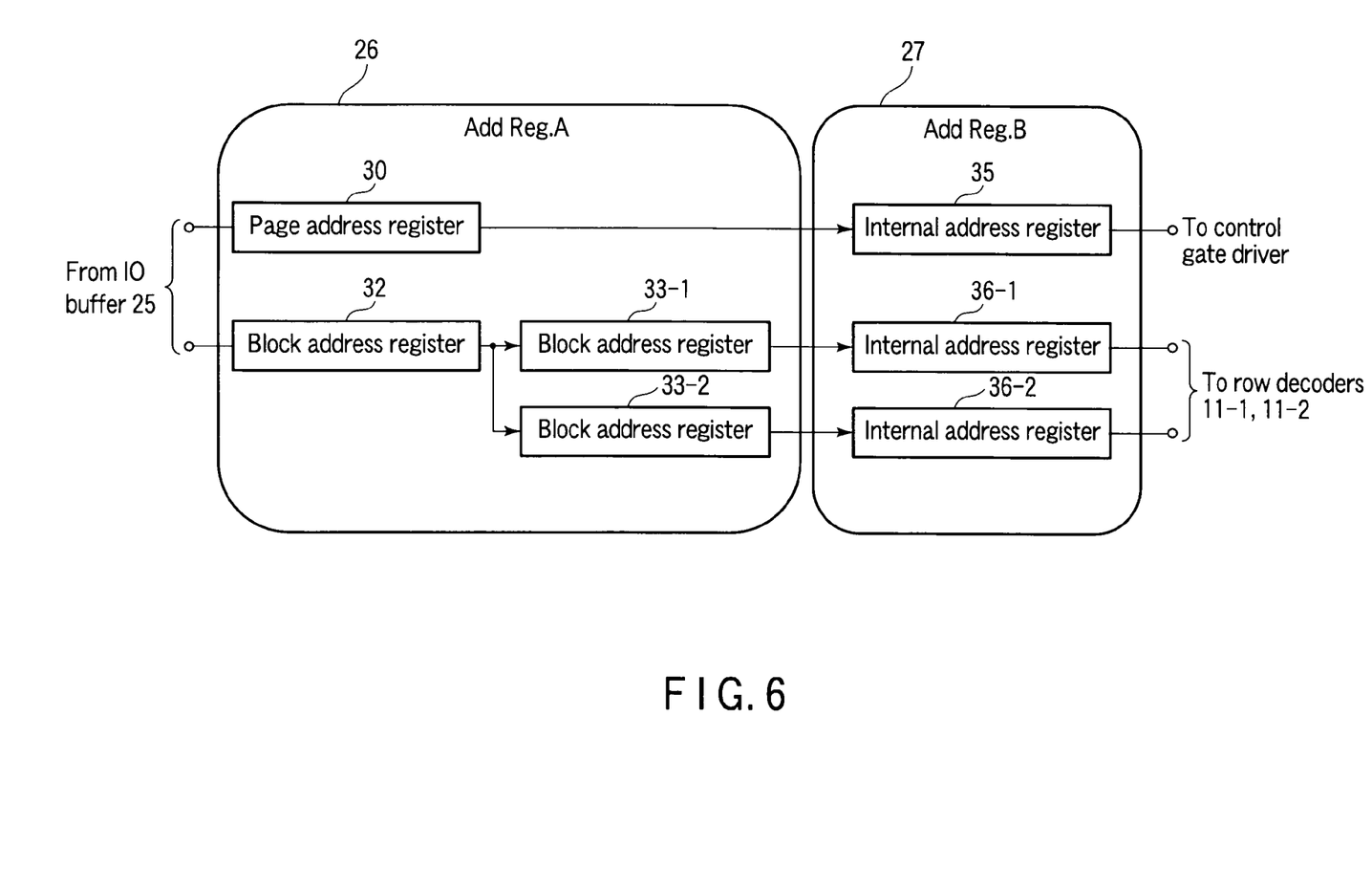
FIG. 6 is a block diagram of the first and second address registers in FIG. 1.

A description is next given of the configuration of the first and second address registers 26 and 27 using FIG. 6. As shown, the address register of this embodiment further comprises internal address registers 35, 36-1 and 36-2 in the second address register 27 that holds page and block addresses Add[page] and Add[block] in readout of data from page n.

Thus, the address register is configured to be able to, during the busy period in the operation of reading data from page n, hold the page address Add[page] and the block address Add[block] of the next page m.

As shown, the first address register (Add reg. A) 26 is constructed from a page address register 30 and block address registers 32, 33-1 and 33-2. The first address register receives the externally input next page address Add[page] and block address Add[block] and temporarily holds them during the ready period in the data read operation. In this example, for the block address Add[block], a pair of block address registers 33-1 and 3-2 are set so as to hold an arbitrary block address fir each of plane 0 and plane 1.

The page address register 30, which is connected at its input to the IO buffer 25, temporarily holds an input page address and then outputs it to the internal address register 35 in the second address register 27.

The block address register 32, which is connected at its input to the IO buffer 25, temporarily holds an input block address and then outputs it to the block address registers 33-1 and 33-2, which in turn output the block address to the internal address registers 36-1 and 36-2, respectively, in the second address register 27.

The second address register (Add Reg. B) 27 is composed of internal block address registers 35, 36-1 and 36-2. The second address register responds to an address control signal (addfetch) from the sequencer 17 to output a page address signal (AC[page]) to the control gate driver 19 and output block and plane address signals (AC[block], AC[plane]) to the row decoders 11-1 and 11-2 during the busy period in an data read operation. It therefore becomes possible to selectively read two or more pages having page addresses common to the planes in an arbitrary block in each plane.

The internal block address register 35 temporarily holds an input block address and then outputs it to the control gate driver 19. The block address registers 36-1 and 36-2 outputs input block addresses to the row decoders 11-1 and 11-2, respectively.

Each command entered from the IO buffer 25 into the command decoder 16 activates the sequence 17. The sequencer controls internal operations of the memory chip, such as data transfer from the latch circuit (SALatch) in each sense amplifier to the cache, data readout from the cell arrays 10-1 and 10-2 to the latch circuits, address transfer from the first address register 26 to the second address register 27, etc.

According to the configuration described above, in a data read operation, the second dedicated address register 27 can hold an arbitrary block address and a page address common to plane 0 and plane 1 for each plane. For this reason, the user system side is allowed to input the address of the next page to the first address register 26 connected to the outside simultaneously with the data read operation.

With a nonvolatile semiconductor storage device of a comparative example to be described later, the data read operation can be carried out only on a plurality of consecutive pages having consecutive addresses in a block. According to this embodiment, however, the data read operation (cache read) can be performed on pages in an arbitrary block for each of the planes, allowing the reading speed and usability to be increased.

2. Cache Read Operation (Data Read Operation)

Figure 7:
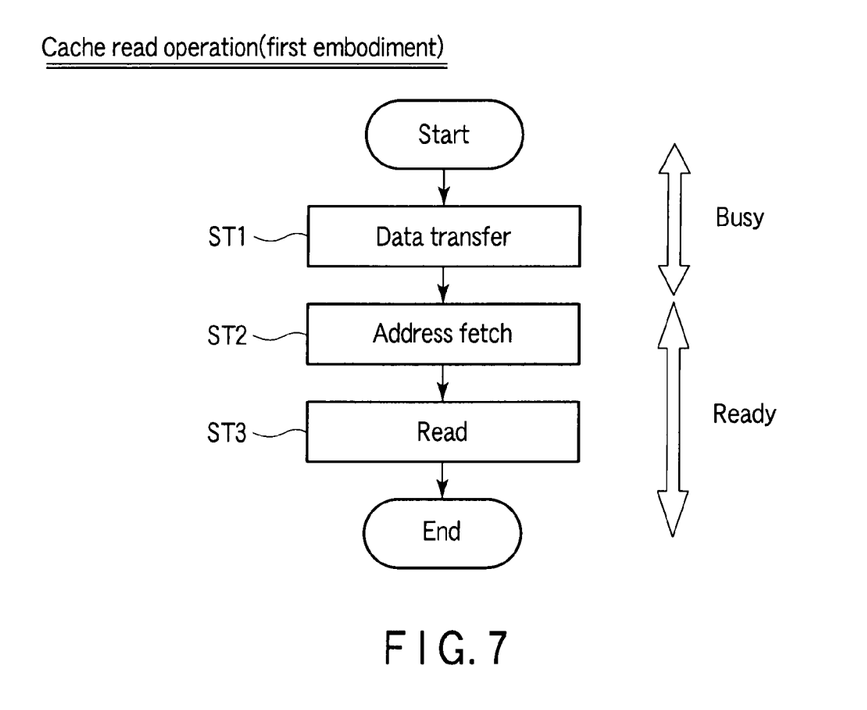
FIG. 7 is a flowchart illustrating the cache read operation of the semiconductor storage device of FIG. 1.
Figure 8:
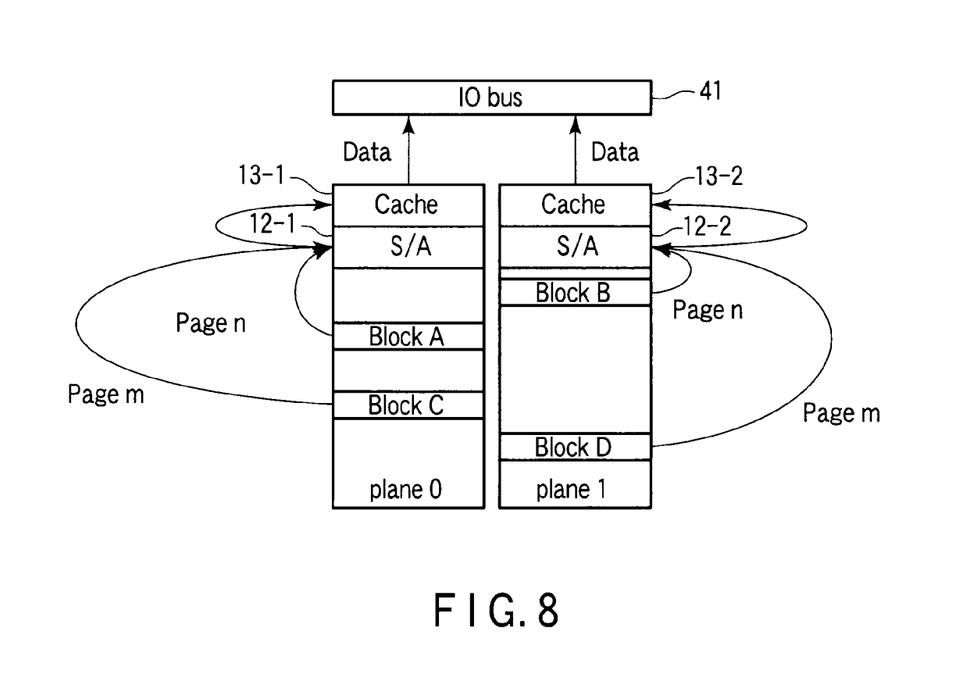
FIG. 8 is a diagram for use in explanation of the cache read operation of the semiconductor storage device of FIG. 1.

Reference is next made to FIGS. 7 through 10 to describe the cache read operation (data read operation) of the nonvolatile semiconductor storage device of this embodiment. The description is given in accordance with the flowchart of FIG. 7. Here, an operation of reading pages n and m in blocks A to D in planes 0 and 1 as shown in FIG. 8 will be described by way of example.

2-1. Cache Read Flow
(Step ST1 (Data Transfer))
In the cache read operation, data is first read from the leading page. Suppose, for example, that data from page n has been read into the sense amplifier (S/A) 12-1. This situation is the state in FIG. 10 in which R/B has returned to the ready state after the operation through t3 progressed. When a cache read operation is activated in this state, data from the page n already read into the sense amplifier 12-1 is first transferred to the data cache 13-1.

During this step, the R/B signal in the busy state is sent from the control signal pin (RBnx) as shown.

(Step ST2 (Address Fetch))
Subsequently, the page address (Add[page m] of the page m to be read from next is transferred to the second address register 27. More specifically, the page address Add[page m] of the page m is transferred to the internal address register 35 in the second address register 27.

(Step ST3)
A page address signal AC[page m] is sent from the second address register 27 to the control gate driver 19.

Subsequently, page reading is carried out in accordance with the page address signal AC[page m] for the page m to be read from next, whereby cell data is read out to the sense amplifier 12-1.

During this step, the R/B signal in the ready state is sent from the control signal pin (RBnx) as shown. On the other hand, the user system transfers the previously read page data from the page n to the outside. During step ST3, the user can freely output the page data from the page n.

2-2. Command Sequence
Next, the command sequence in the cache read operation of the nonvolatile semiconductor storage device of this embodiment will be described with reference to FIGS. 8 and 9. As an example, a description is given of an operation of reading pages n and m in blocks A and B in the two planes 0 and 1 in FIG. 8 in parallel. In this description, other control signals are omitted.

Figure 9:
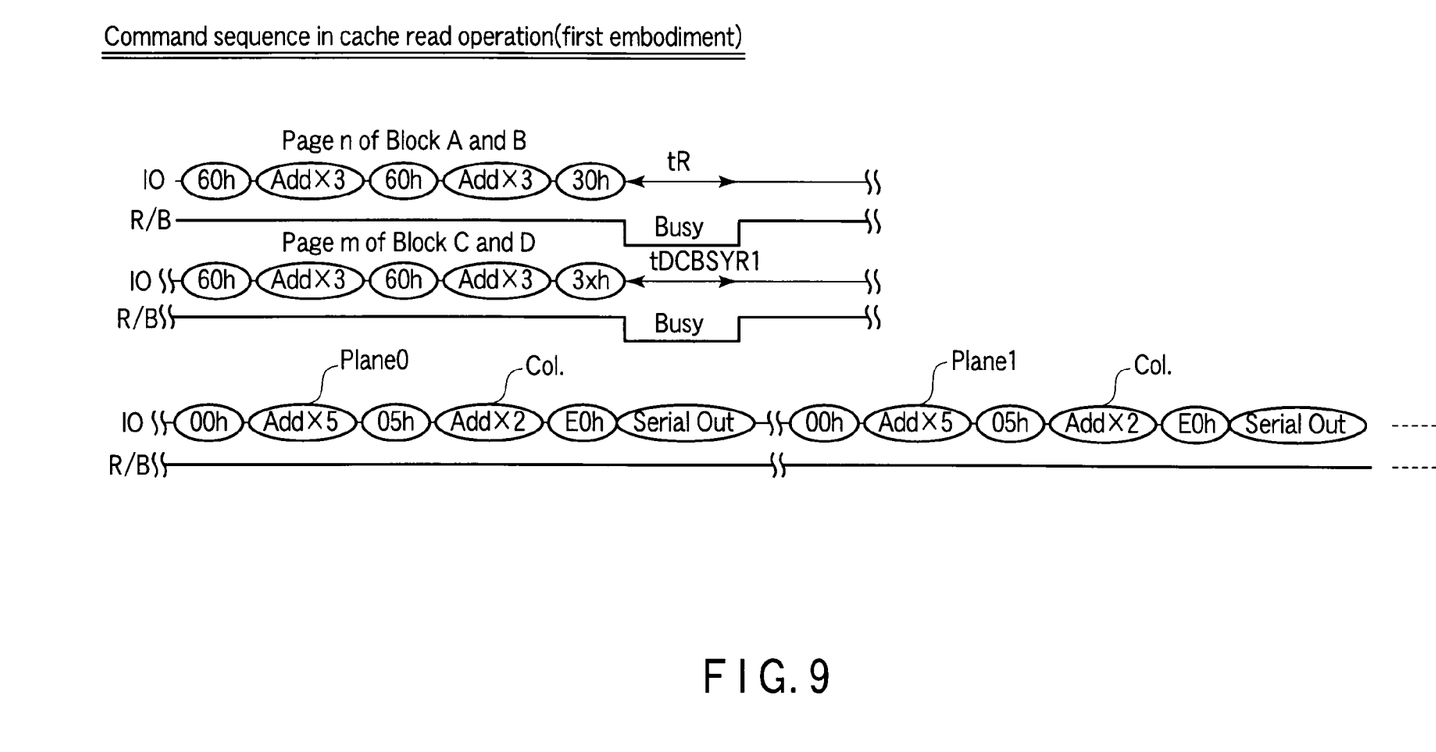
FIG. 9 shows a command sequence in the cache read operation of the semiconductor storage device of FIG. 1.

First, as shown in the upper portion of FIG. 9, the first read operation is carried out on the page n. That is, in the state where the R/B signal is at the high level (ready), the leading command 60h and page, block and plane addresses are sequentially fed from the IO pin into the chip for each plane in three cycles of the WEnx clock. This input sequence is performed once for each of the two planes and finally a read operation activation command 30h is fed into the chip.

Subsequently, in the state where the R/B signal is at the low level (busy) during time tR, the data read operation is carried out in accordance with the input addresses.

Subsequently, as shown in the middle portion of FIG. 9, the addresses and the cache read activation command are input for the page m to be read next. That is, in the state where the R/B signal is at the high level (ready), the leading command 60h and page, block and plane addresses are sequentially fed from the IO pin into the chip in three cycles of the WEnx clock. This input sequence is performed once for each of the two planes and finally a read operation activation command 3xh is fed into the chip. At this point, the block and page addresses of the page m are designated and the activation command 3x is input. Therefore, the addresses can be designated in the command 60h for each of the planes 0 and 1. As a result, the block address can be arbitrarily designated for each of the planes 0 and 1, which is useful in increasing the reading speed and usability.

Next, when data read from the pages n in the planes 0 and 1 are transferred from the sense amplifiers 12-1 and 12-2 to the data caches 13-1 and 13-2 in the state where the R/B signal is at the low level (busy) during time tDCBSYR1, the R/B signal goes high (ready).

Subsequently, the read page data are transferred by a read command for each plane in synchronism with a read enable signal (RE) input to the control pin (REnx).

That is, as shown in the lower portion of FIG. 9, data are transferred by feeding the leading command 00h, plane address (plane 0) Add×5, command 05h, column address Add×2, command E0h and read command Serial Out from the IO pin into the chip in the state where the R/B signal is at the high level (ready).

subsequently, as shown in the lower portion of FIG. 9, data are likewise transferred by feeding the leading command 00h, plane address (plane 1) Add×5, command 05h, column address Add×2, command E0h and read command Serial Out from the IO pin into the chip in the state where the R/B signal is at the high level (ready).

At the same time, data is read from the page m in accordance with the plane address, the block address and the page address indicated in the middle portion of FIG. 9.

2-3. Cache Read Timing

Figure 10:
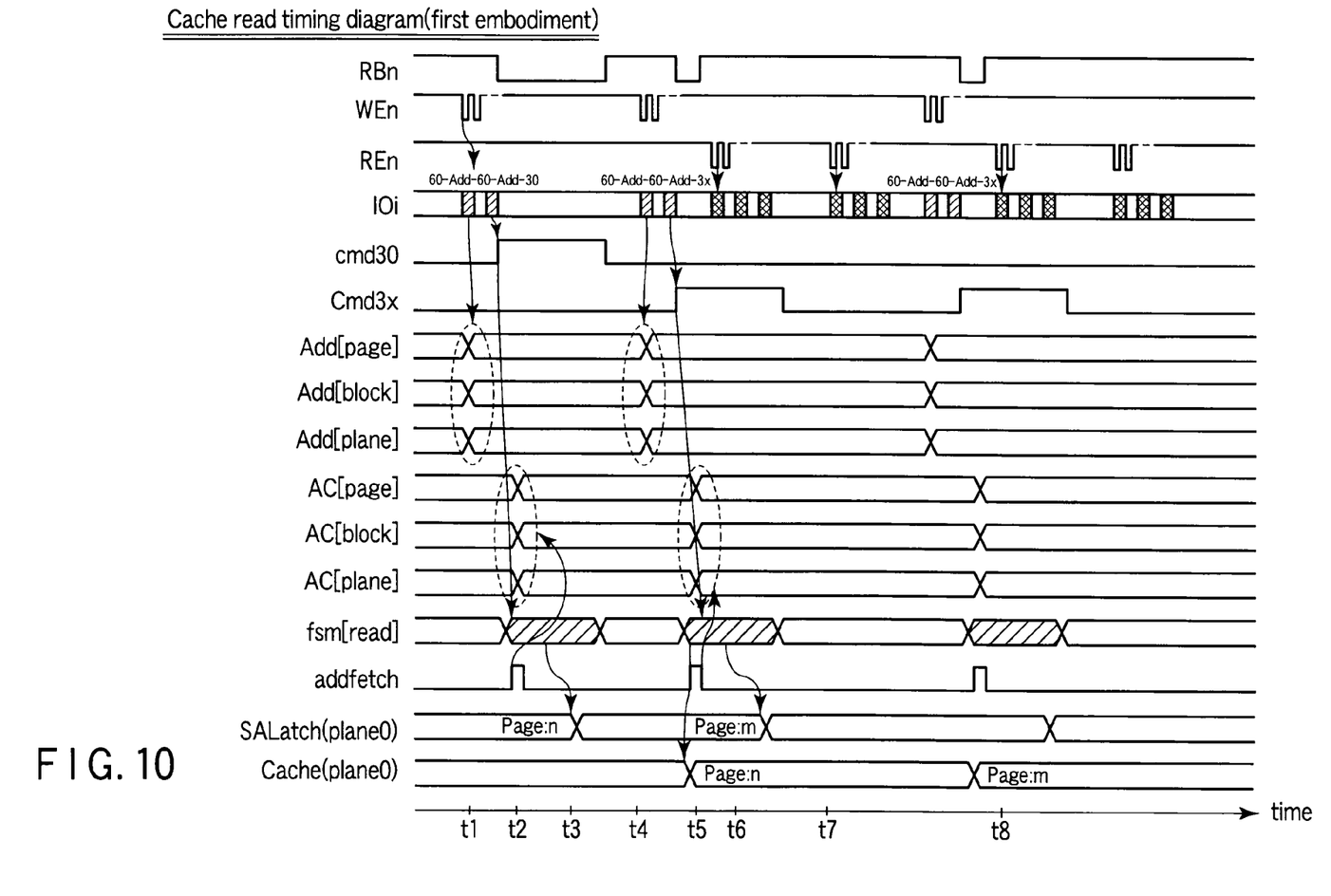
FIG. 10 is a timing diagram of the cache read operation of the semiconductor storage device of FIG. 1.

Reference is next made to FIG. 10 to describe the timing diagram of the cache read operation of the nonvolatile semiconductor storage device of this embodiment. Here, the operation of reading data from pages n and m in the block A in the plane 0 will be described by way of example.

As shown, at time t1 in the state where the R/B signal is low (ready) and the RE signal is high, the command 60h is taken in from the IO pin (Ioi) on an rising edge of the WE signal and then page, block and plane addresses Add[page], Add[block] and Add[Plane] are taken in. This operation is repeated for each of the two planes.

At time t2, the command decoder 16 outputs a command signal Cmd30 to the sequencer 17, so that the R/B signal goes low (busy).

Subsequently, the sequencer 17 outputs an address control signal (addfetch), which is a clock signal synchronized with given timing, to the second address register 27. Thereby, address data in the first address register 26 is transferred to the second address register 27.

Subsequently, the second address register 27 outputs a page address signal (AC[page]) to the control gate driver 19 and a block address signal (AC[block]) and a plane address signal (AC[plane]) to the row decoder 11-1.

Data is then read from the page n in accordance with the address signals and the read data is latched and held by the sense amplifier at time t3. After that, the R/B signal goes high (ready).

At time t4 in the state where the RE signal is high, page, block and plane addresses Add[page], Add[block] and Add[plane] are taken in from the IO pin (IOi) on the rising edges of the WE signal.

At time t5, when the command 3xh is taken in from the IO pin, the command decoder 16 outputs the command signal Cmd3x to the sequencer 17. This causes the RB signal to go high (busy). The previously read data from the page n is transferred from the latch circuit (SALatch(plane0)) in the sense amplifier to the data cache 13-1.

The sequencer 17 then outputs an address control signal (addfetch) to the second address register 27, so that address data in the first address register 26 is transferred to the second address register 27.

The second address register 27 then outputs a page address signal to the control gate driver 19 and a block address signal (AC[block]) and a plane address signal (AC[plane]) to the row decoder 11-1 in accordance with the address control signal.

As shown in FIG. 6, this embodiment is equipped with the first and second address registers 26 and 27. For this reason, in the state where the R/B signal is at the high level (ready state) during the interval between t4 and t5, the first address register 26 holds the command 3xh and externally input addresses (Add [page] and so on).

At time t5 when the R/B signal is low (busy state), the second address register 27 transfers address signals (AC [page] and so on) in accordance with an address control signal (addfetch).

Data is read from the next page m (page: m) in accordance with addresses transferred to the second address register 27. Upon completion of the transfer of the address signals (AC [page] and so on) from the second address register 27, the R/B signal goes high (ready state), causing the chip to return to the ready state.

Thereby, the user system side comes to enable to output data. The aforementioned series of operations is controlled by the sequencer 17.

Subsequently, the chip performs the operation of reading data from the next page into the latch circuit (SALatch [plane0]) in the sense amplifier. During this period, the chip is in the ready state and the user is therefore allowed to output data. The user is allowed to output data for each of the two planes (plane 0 and plane 1). Concurrently with this I/O operation, the chip reads data from the next page in the cell array into the latch circuit (SALatch[plane0]).

Subsequently, at time t6 in the state where the R/B signal is high and the RE signal is high, the previously read data from the page n are output serially from the data IO pin (IOi) to the outside on the falling edges of the read enable (RE) signal input to the REn pin.

At time t7 and thereafter, the sequencer 17 stops the operation if the reading from cells has terminated and the next command 3xh is not input as in this example.

Although not shown in this example, if the next command 3xh is input before the operation of reading from cells is complete at time t6, data transfer from the S/A latch (SALatch [plane0]) to the data cache (Cache[plane]) and address data transfer from the first address register 26 to the second address register 27 are carried out upon termination of the cell data read operation.

As shown in FIG. 6, this embodiment is equipped with the first and second address registers 26 and 27. For this reason, at time t6 in the state where the R/B signal is at the high level (ready state), the first address register 26 holds the command 3xh and externally input addresses (Add[page], AC[block], AC[page]).

At time t6, the second address register 27 has transferred address signals (AC[page] and so on) to the inside in accordance with an address control signal (addfetch) and can proceed with the operation of reading from cells.

At time t8 in the state where the R/B signal is high and the RE signal is high after the next page read command 3xh has been input, data read from the next page m are serially output from the data IO pin (IOi) to the outside on the falling edges of the read enable signal input to the REn pin.

3. Advantages of the Embodiment

According to the nonvolatile semiconductor storage device and the data read operation of the embodiment, at least the following advantages (1) and (2) can be obtained.

(1) A cache read operation can be performed by randomly designating the block and page addresses of arbitrary pages, allowing the reading speed to be increased.

As described above, according to the configuration of the embodiment, the second address register (dedicated address register) 27 is provided which holds addresses (Add[page], Add[block], Add[plane]) for internal reading in the cache read operation (data read operation).

for this reason, the block and page addresses of a page to be read from (in this example, page n) can be held by the second address register 27 for each plane. As a result, the user system side is allowed, simultaneously with the above operation, to enter the block and page addresses of the next page to be read from (in this example, page m) into the first address register 26.

For this reason, this embodiment is useful in speeding up the data read operation (data read operation) in that a cache read operation can be performed on pages in arbitrary locations (page and block addresses).

On the other hand, a comparative example of a nonvolatile semiconductor storage device to be described later is not provided with a dedicated address register. Therefore, only consecutive pages in consecutive locations within a block can be read in a data read operation. Thus, the cache read operation of the comparative example is to consecutively read two or more pages contained in a single block.

The read time of recent memory cells tends to increase and therefore the cache read has become an essential function. The system of the comparative example cannot access pages randomly. In particular, this imposes restrictions in reading information stored in a specific page in each block so as to span two or more blocks. For this reason, with the comparative example, the cache read cannot be used in reading data which reside across two or more blocks, increasing the read time.

(2) The embodiment is useful in increasing the usability. As described above, a cache read operation in which the page addresses of arbitrary pages are randomly designated can be performed.

In this example, as shown in FIG. 3, the user data UD1 are stored in the data storage area 22-1 so as to span three blocks (block X to block Z). The associated management data CCD1 to CD4 are stored in the redundant areas 22-2 in certain units of the user data.

Thus, the management data reside scattered on the memory space of the plane. In other words, the management data reside in random blocks and pages.

It is also required to quickly read the management data CD1 to CD4 which reside in random locations in the memory space. The cache read system of the comparative example to be described later cannot be used in reading data which reside scattered in two or more blocks. In such a case, the data reading operation cannot be speeded up and the usability decreases, With the embodiment, on the other hand, even if the user data and the management data are reside scattered on the memory space of the multiple planes (plane 0 and plane 1), the cache read can be carried out, allowing the data reading speed to be increased and the usability to be increased.

Comparative Example with no Second Address Register

Reference is next made to FIGS. 11 to 14 to describe an example of a nonvolatile semiconductor storage device for comparison with the nonvolatile semiconductor storage device of the first embodiment. This comparative example is not provided with the second address register. In the description, the detailed descriptions of portions which correspond to those in the first embodiment are omitted.

<Configuration of Address Register>

Figure 11:
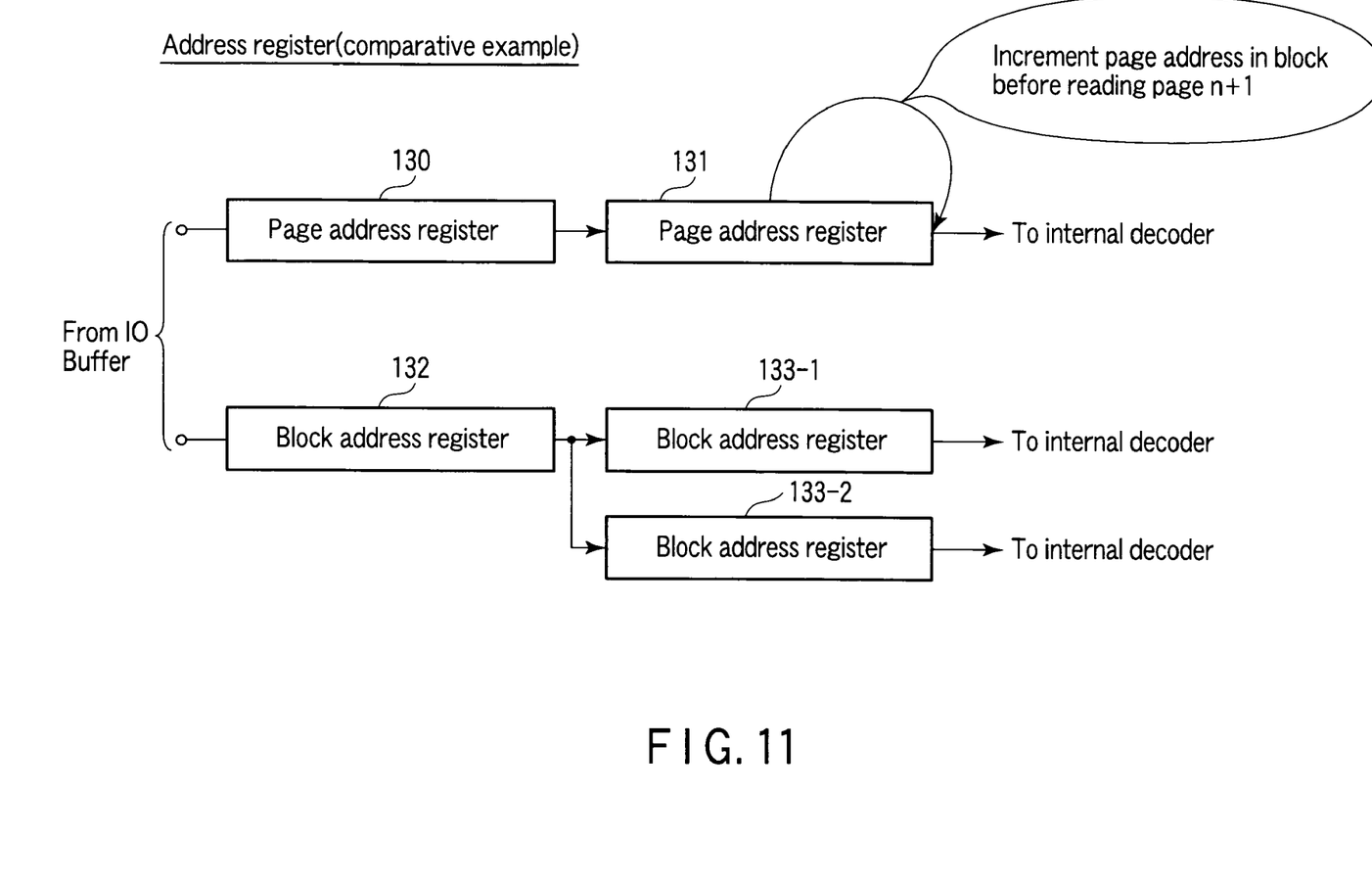
FIG. 11 shows the arrangement of address registers in a comparative example of a semiconductor storage device.

Reference is first made to FIG. 11 to describe the configuration of an address register of the nonvolatile semiconductor storage device of this comparative example.

The comparative example is different from the first embodiment in that the address register is not provided with the second address register.

That is, the address register of the comparative example is composed of page address registers 130 and 131 and block address registers 132, 133-1 and 133-2. For this reason, page and block addresses input from the IO buffer are directly output to the internal decoder.

<Cache Read Operation>

Figure 12:
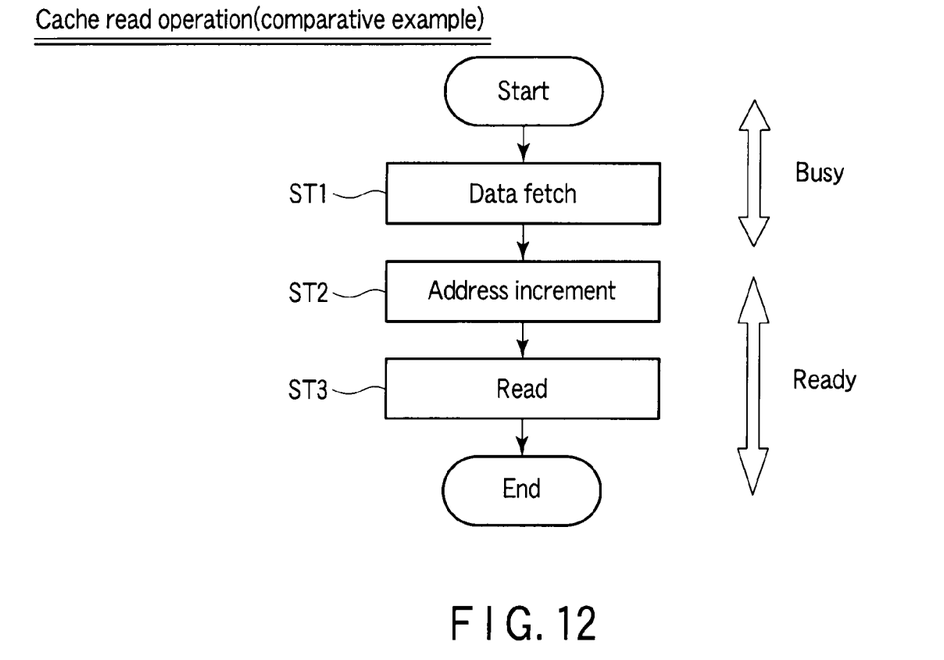
FIG. 12 is a flowchart illustrating the cache read operation of the comparative example.
Figure 13:
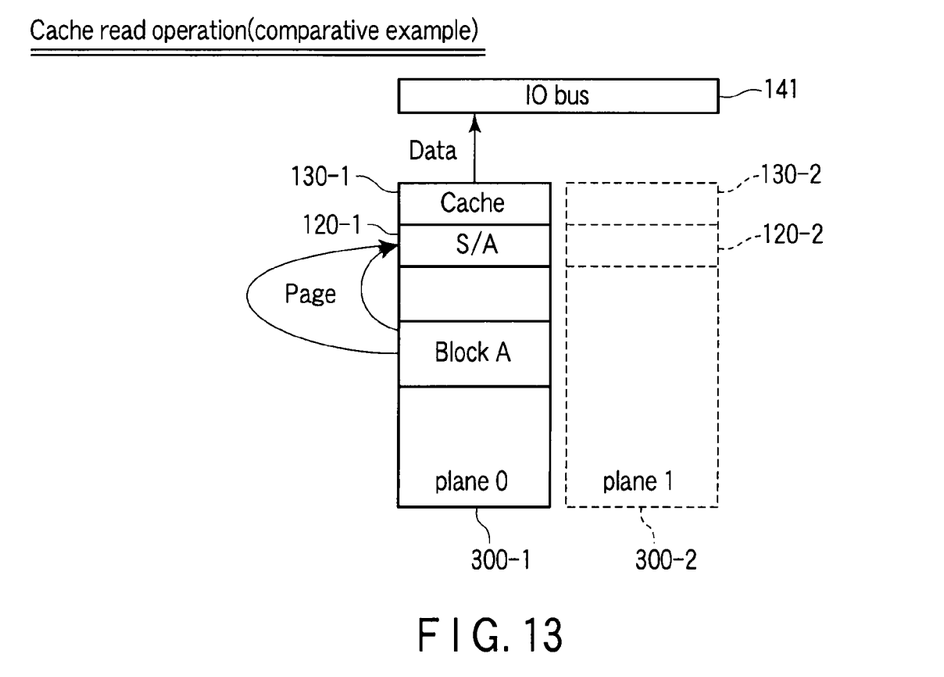
FIG. 13 is a diagram for use in explanation of the cache read operation of the comparative example.
Figure 14:
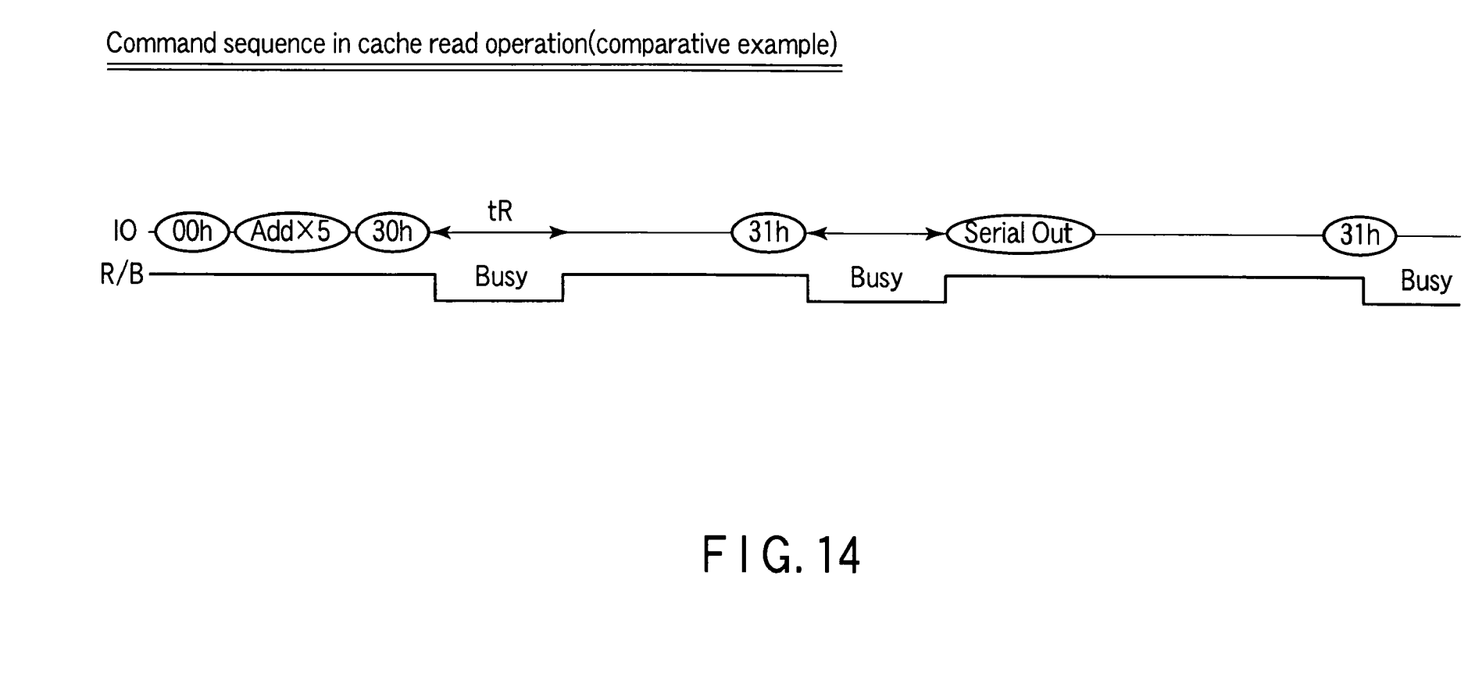
FIG. 14 shows a command sequence in the cache read operation of the comparative example.

Reference is next made to FIGS. 12 to 14 to describe the cache read operation of the nonvolatile semiconductor device of the comparative example. The flow of the cache read operation is illustrated in FIG. 12. The planes 0 and 1 in this operation are indicated as in FIG. 13.

[Step ST1 (Data Fetch)]

First, page data from, say, page n read from the sense amplifier (S/A) is transferred to the address register.

During step ST1, the R/B signal from the control pin (RBnx) is set to the busy state as shown.

(Step ST2 (Address Increment))

Next, as shown in FIG. 11, the page address of the page n+1 to be read from next (not arbitrary page m) in the page address register 131 is incremented by one (n=n+1).

In step ST2 and thereafter, the R/B signal from the control pin (RBnx) is set to the ready state as shown.

(Step ST3 (Read))

The page n+1 is read in accordance with the incremented page address and cell data are read into the sense amplifier.

As described above, the cache read operation of the comparative example is such that the read operation is started by designating the address of the leading page (step ST1) and then the page address is sequentially incremented (step ST2) to read consecutive pages in a designated block.

For this reason, page data cannot be accessed randomly. In particular, the cache read operation cannot be used in reading a particular page in each block or information stored in a portion of a particular page so as to span two or more blocks. The usual read operation to transfer data from memory cells to the data register for each page and output data in the data register to the outside has to be carried out on a particular page of each block, which is disadvantageous to speeding up of the read operation.

<Command Sequence in Cache Read Operation>

Reference is next made to FIG. 14 to describe the command sequence in the cache read operation of the nonvolatile semiconductor storage device of the comparative example.

As shown, after a leading command 00h is input to the IO pin in the state in which the R/B signal is at the high level (ready state), block and page addresses are designated in subsequent address (Addx5) input cycles and then a command 30h is input. Thereby, the operation of reading the leading page is started and the leading page data is read from the cell array into the sense amplifier.

At the termination of this internal operation, the R/B signal is set to the high level.

In the state in which the R/B signal is high (ready state), a command 31h issued by the user system side is taken in. Thereby, previously read data is transferred from the sense amplifier to the data cache. The user system is allowed to output the data thus read to the outside. The data is serially output to the outside.

Concurrently with the data output operation, data is read from the page n+1 (the page address has been incremented) in the state where the R/B signal is at the low level (busy state).

After that, the same operations are carried out.

In applications using a NAND flash memory, user data and their associated management data are stored. The user data are usually stored across two or more blocks. The associated management data are stored in certain units of user data. In this case, the management data reside scattered on the memory space. In other words, the management data reside in random blocks and pages. It is also required to quickly read the management data which reside in random locations in the address space.

The cache read system of the comparative example cannot be used in reading data which reside across two or more blocks and is therefore disadvantageous to speeding up of the data read operation and moreover usability.

Although the first embodiment has been described in terms of a NAND flash memory of two-layer gate structure having a floating gate electrode (FG) and a control gate electrode (CG), this is not restrictive. The principles of the invention are equally applicable to a metal-oxide-nitride-oxide-silicon (MONOS) nonvolatile semiconductor storage device which uses a film of silicon nitride (Si3N4) in place of the floating gate electrode as the charge storage layer or a tantalum nitride-aluminum oxide-oxide-nitride-oxide-silicon (TANOS) nonvolatile semiconductor storage device which uses a film of, say, alumina (Al2O3) as the charge storage layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first memory cell array having a first plane which is composed of a plurality of blocks each having a plurality of memory cells arranged in a matrix form at intersections of bit lines and word lines;
   a sense circuit which reads data the memory cells;
   a sequencer which receives control signals from outside;
   a first address register which receives an address from outside; and
   a second address register which receives an output address from the first address register and outputs an address signal in response to an address control signal from the sequencer,
   the sequencer, in reading from the memory cells, reading a page n in accordance with the address stored in the second address register, then transferring an address stored in the first address register to the second address register concurrently with outputting data read from the page n to outside and reading data from an arbitrary page m in accordance with the address transferred to the second address register.

2. The device according to claim 1, further comprising a second memory cell array having a second plane which is composed of a plurality of blocks each having a plurality of memory cells arranged in a matrix form at intersections of bit lines and word lines.

3. The device according to claim 1, wherein the first address register is provided with a first page address register having its input connected to receive a page address, a first block address register having its input connected to receive a block address, a second block address register having its input connected to the output of the first block address register, and a third block address register having its input connected to the output of the first block address register.

4. The device according to claim 1, wherein the second address register is provided with a first internal address register having its input connected to the output of a first page address register, a second internal address register having its input connected to the output of a second block address register, and a third internal address register having its input connected to the output of a third block address register.

5. The device according to claim 2, wherein each of the blocks has a plurality of pages which are arranged along the word lines and each of which is composed of a data area and a redundant area.

6. The device according to claim 5, wherein user data and management data stored in the pages reside scattered across the blocks of the first and second planes.

7. The device according to claim 1, wherein the page, block and plane addresses stored in a second page address register are arbitrary.

8. The device according to claim 7, further comprising a control buffer which receives, amplifies and holds the control signal.

9. The device according to claim 1, further comprising a command decoder which decodes a command input from a control buffer to send it to the sequencer.

10. The device according to claim 2, wherein the each of the first and second memory cell arrays is a NAND flash memory.

11. A method of reading data from a semiconductor memory device comprising:
    reading a page n in accordance with an address stored in a second address register;
    transferring an address stored in a first address register to the second address register concurrently with outputting of data read from the page n to outside; and
    reading an arbitrary page m in accordance with the transferred address.

12. The method according to claim 11, wherein the semiconductor memory device comprises:
    a first memory cell array having a first plane which is composed of a plurality of blocks each having a plurality of memory cells arranged in a matrix form at intersections of bit lines and word lines;
    a sense circuit which reads data the memory cells;
    a sequencer which receives control signals from outside;
    the first address register receives an address from outside; and
    the second address register receives an output address from the first address register and outputs an address signal in response to an address control signal from the sequencer.

13. The method according to claim 12, wherein the semiconductor memory device further comprises a second memory cell array having a second plane which is composed of a plurality of blocks each having a plurality of memory cells arranged in a matrix form at intersections of bit lines and word lines.

14. The method according to claim 12, wherein the first address register is provided with a first page address register having its input connected to receive a page address, a first block address register having its input connected to receive a block address, a second block address register having its input connected to the output of the first block address register, and a third block address register having its input connected to the output of the first block address register.

15. The method according to claim 12, wherein the second address register is provided with a first internal address register having its input connected to the output of a first page address register, a second internal address register having its input connected to the output of a second block address register, and a third internal address register having its input connected to the output of a third block address register.

16. The method according to claim 12, wherein each of the blocks has a plurality of pages which are arranged along the word lines and each of which is composed of a data area and a redundant area.

17. The method according to claim 16, wherein user data and management data stored in the pages reside scattered across the blocks of the first plane and a second plane.

18. The method according to claim 12, wherein the page, block and plane addresses stored in a second page address register are arbitrary.

19. The method according to claim 12, the memory device further comprises a control buffer which receives, amplifies and holds the control signal.

20. The method according to claim 12, the memory device further comprises a command decoder which decodes a command input from a control buffer to send it to the sequencer.

* * * * *